United States Patent [19]

Alexander, Jr. et al.

[11] 4,033,287

[45] July 5, 1977

[54] RADIAL FLOW REACTOR INCLUDING GLOW DISCHARGE LIMITING SHIELD

[75] Inventors: Frank Bernard Alexander, Jr., Paterson; Cesar Deduyo Capio, Fords, both of N.J.; Victor Emerald Hauser, Jr., Palmerton, Pa.; Hyman Joseph Levinstein, Berkeley Heights, N.J.; Cyril Joseph Mogab; Ashok Kumar Sinha, both of Murray Hill, N.J.; Richard Siegfried Wagner, Bernardsville, N.J.

[73] Assignee: Bell Telephone Laboratories, Incorporated, Murray Hill, N.J.

[22] Filed: Jan. 22, 1976

[21] Appl. No.: 651,555

[52] U.S. Cl. .......................... 118/49.1 R; 313/210
[51] Int. Cl.² ........................................ C23C 13/08
[58] Field of Search .................... 118/48–49.5; 427/39, 40, 41; 313/516, 210, 220

[56] References Cited

UNITED STATES PATENTS

| 1,560,103 | 11/1925 | Schmierer | 313/516 |
| 3,675,066 | 7/1972 | Armstrong et al. | 313/210 X |
| 3,757,733 | 9/1973 | Reinberg | 118/49.5 |

*Primary Examiner*—Morris Kaplan
*Attorney, Agent, or Firm*—Irwin Ostroff

[57] ABSTRACT

An improved radio frequency (rf) powered radial flow cylindrical reactor utilizes a gas shield which substantially limits the glow plasma discharge reaction to a section of the reactor over the semiconductor substrates which are to be coated. The gas shield permits the use of higher rf input power which contributes to the formation of protective films that have desirable physical and electrical characteristics.

5 Claims, 8 Drawing Figures

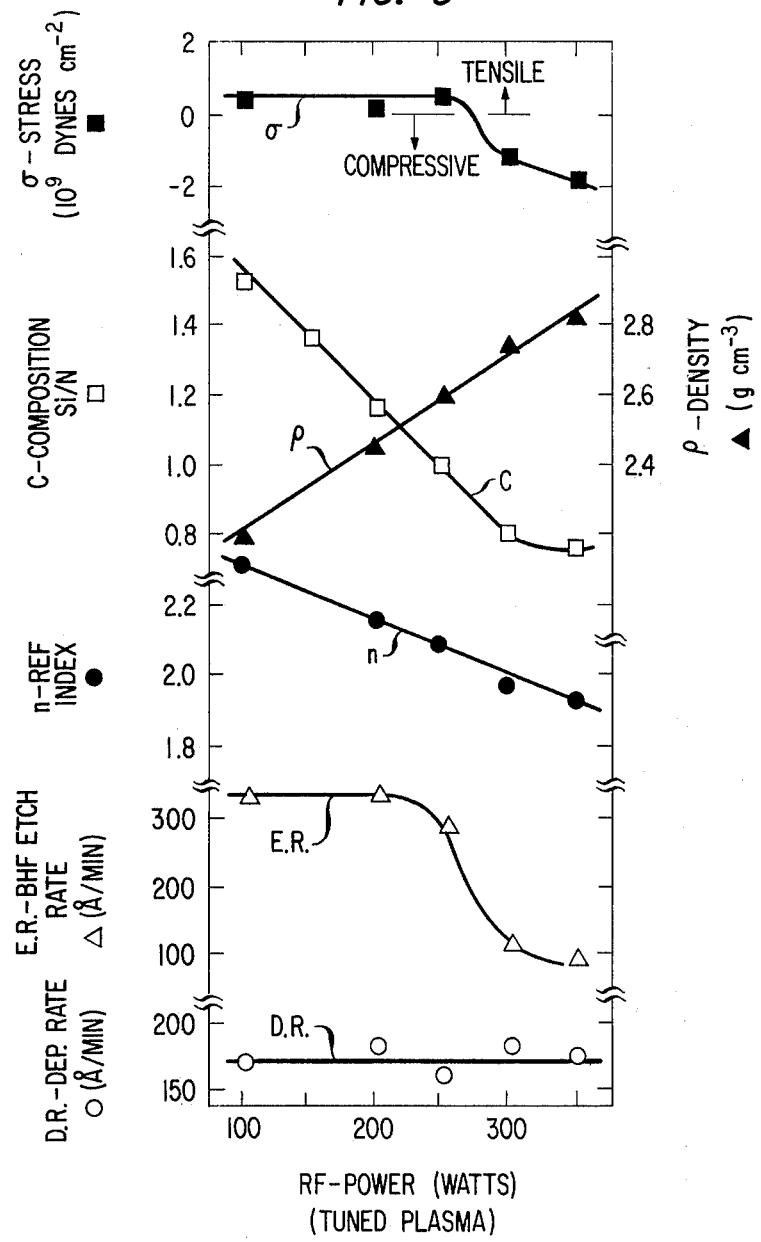

RADIAL FLOW REACTOR INCLUDING GLOW DISCHARGE LIMITING SHIELD

BACKGROUND OF THE INVENTION

This invention relates to apparatus for depositing coatings on suitable substrates and, more particularly, to an improved radial flow reactor for coating semiconductor substrates utilizing laminar flow of reactant gases in a radial direction.

The invention will be described specifically with reference to use in depositing silicon-nitrogen films on silicon substrates although it should be evident that it is not limited thereto. The methods of depositing such films is described more fully and claimed in copending application of Houser et al., Ser. No. 651,556 and application of Levenstein et al., Ser. No. 651,557, each filed concurrently with this applicaton and having the same assignee as the instant application.

The reliability of semiconductor devices, particularly metal oxide insulator semiconductor device (MOS) is largely a function of the manner in which they are passivated and how the completed devices are isolated from the environment. U.S. Pat. No. 3,757,733, Reinberg, illustrates and teaches the use of an rf powered radial flow cylindrical reactor for coating a plurality of semiconductor substrates with an inorganic film by a low-temperature plasma deposition technique. One of the problems with this reactor is that the glow discharge reaction tends to occur prematurely in a portion of the chamber which is below the semiconductor substrates. This undesirable reaction tends to deplete the gases that eventually flow over the semiconductor substrates that are to be coated. This results in a somewhat nonuniform coating of the substrates. In addition, this premature reaction limits the amount of power that can be supplied by the rf source and results in films which tend to have a relatively high tensile stress and relatively low density. Both these characteristics have been found to contribute to cracking of the films.

It would be desirable to have an improved radial flow reactor in which a plasma discharge reaction occurs that is substantially limited to the area above and near the semiconductor substrates to be coated. Such an improved chamber would facilitate the formation of protective films which are both uniform in coverage and have relatively high resistance to cracking.

SUMMARY OF THE INVENTION

The present invention is directed to a radio frequency (rf) powered radial flow reactor which comprises a top plate, a bottom plate, and cylindrical side walls all connected in a sealing relationship therwith to define an evacuable chamber. First and second electrodes, which are both typically parallel cylindrical plate-like members, are contained within the reactor. The first electrode is electrically coupled to an rf power source, and the second electrode is electrically coupled to a reference potential which is typically ground potential. The second electrode has a central aperture therein. Heater elements are coupled to the second electrode. A first sheath or tube communicates through the bottom plate in a sealing relationship and extends through to the top surface of the second electrode so as to be in open communication with the aperture in the second electrode. The other end of the first sheath is in open communication with a vacuum pump.

A cylindrical gas shield surrounds and is closely spaced with all but the top surface of the second electrode. Input gases to the reactor are introduced into a gas ring which exits in the cavity between the gas shield and second electrode and then pass over the semiconductor substrates and are exhausted through the aperture therein.

Semiconductor substrates on which it is desired to deposit protective films are placed on a top surface of the second electrode.

When the rf source is activated and appropriate gases are introduced into the reactor chamber, a glow discharge reaction occurs in the space between the two electrode. The gas shield is typically spaced from ⅛ inch to ¼ inch from the second electrode. This limits the glow discharge reaction to essentially just the region between the two electrodes and substantially inhibits the forming thereof elsewhere in the reactor. The gas shield serves to intensify the glow discharge reaction immediately above the substrates. Thus higher rf power than would otherwise be practical can be effectively used to increase the intensity of the rf glow discharge reaction.

These and other features and advantages of the invention will be better understood from a consideration of the following description taken in conjunction with the accompanying drawings.

BRIEF DESCRIPTION OF THE DRAWINGS

FIGS. 4, 5, 6, 7 and 8 each illustrate a separate graph which has as the abscissa axis one of the variables of a method for the deposition of films on semiconductor substrates, and as the ordinate axis corresponding characteristics of the deposited films.

DETAILED DESCRIPTION

Figure 1:
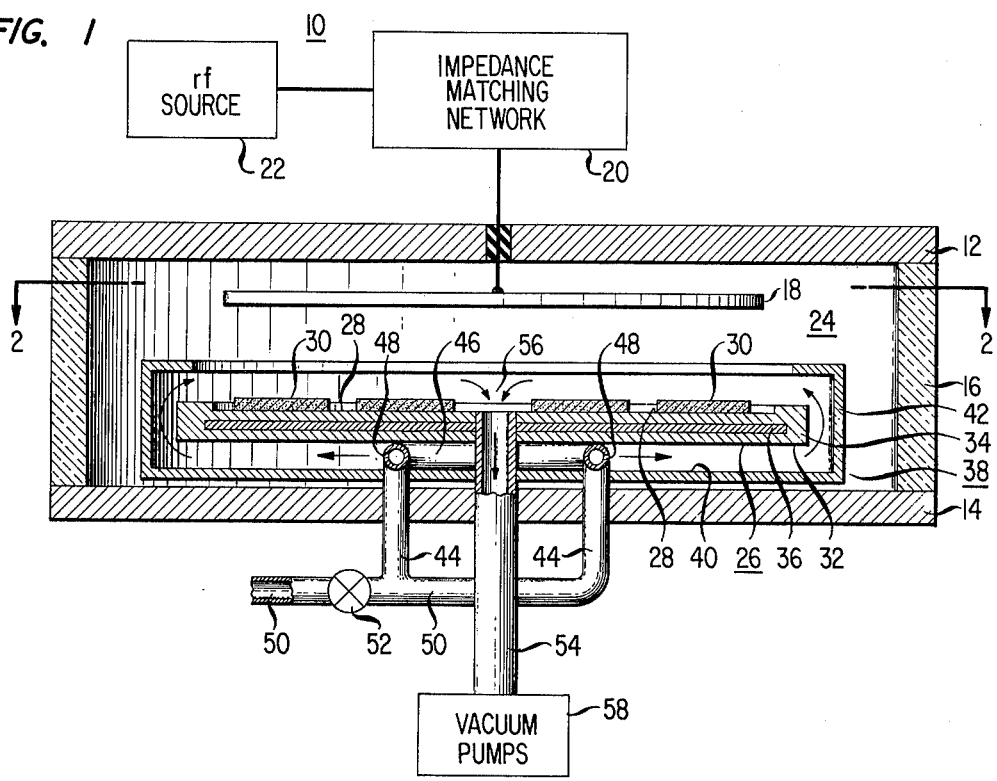
FIGS. 1 and 2 illustrate one embodiment of a radial flow reactor in accordance with one embodiment of the invention.
Figure 2:
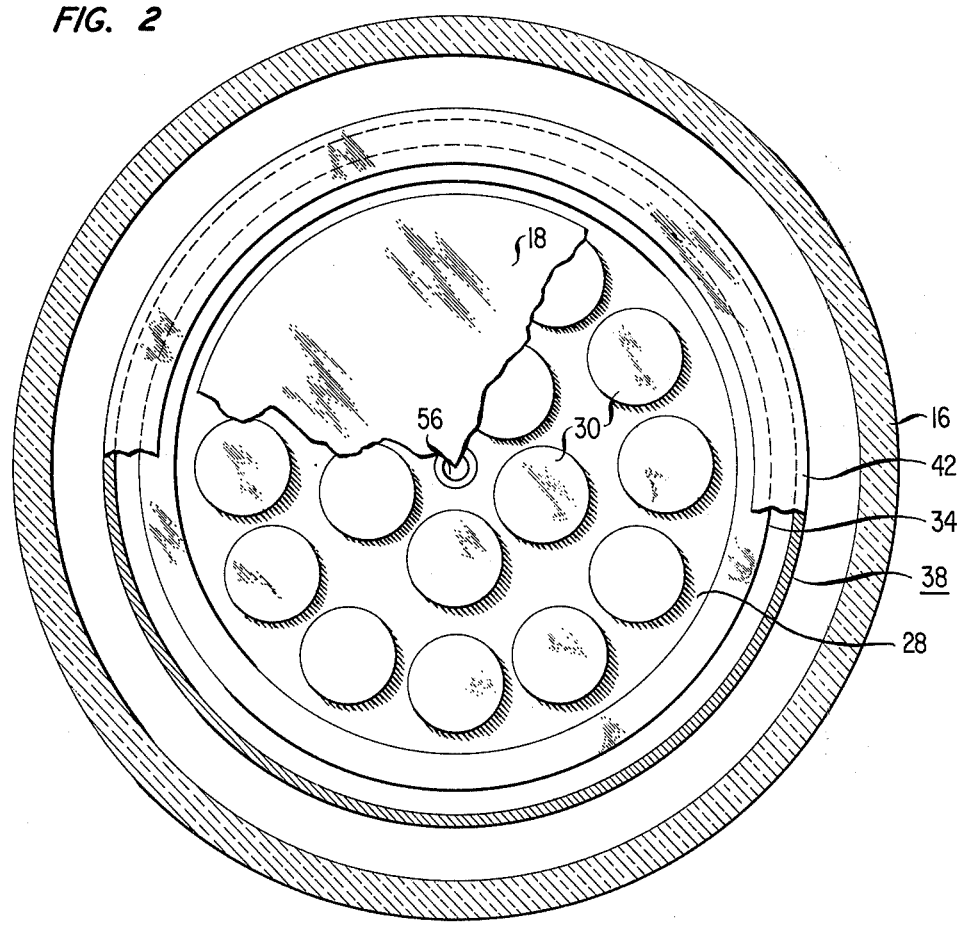

Referring now to FIGs. 1 and 2, there is illustrated in a cross-section and a top view a cylindrical readial flow radio frequency (rf) powered reactor 10. Reactor 10 comprises a top plate section 12, a bottom plate section 14, and cylindrical side wall 16. Side wall 16 is connected to the top and bottom of plates 12 and 14 in a sealing relationship to define an evacuable chamber 24. A first electrode 18, which is typically a circular metallic member, is coupled to an rf source 22 through an impedance matching network 20. Electrode 18 illustrated as electrically isolated from top plate 12. A second electrode 26, which is typically a circular metallic member, comprises a top surface 28, which is adapted to support semiconductor substrates 30, a bottom portion 32, and an end portion 34. Heaters 36, which are typically contained with electrode 26, are utilized to heat the semiconductor substrates 3 to a preselected temperature.

A gas flow shield 38 is closely spaced to electrode 26 and essentially surrounds electrode 26 except for the portion of the top surface 28 thereof on which the semiconductor substrates wafers 30 are placed. A bottom portion 40 of shield 38 is essentially parallel to bottom portion 32 of electrode 26. A U-shaped end portion 42 of shield 38 surrounds the end portion 34 os electrode 26.

A Plurality of sheaths or tubes 44 communicate with the internal portion of chamber 24 extending through the bottom plate 14 and bottom portion 40 of shield 38 in a sealing relationship. Sheaths 44 are coupled at first ends thereof to a gas ring 46 which has a plurality of essentially equally spaced small apertures 48 therethrough. Gas ring 46 exists in the cavity between the bottom portion 32 of electrode 26 and the bottom portion 44 of gas shield 38. Sheaths 44 are connected by second ends thereof to a common sheath (tube) 50 which has a control valve 52 connected in series therewith.

A sheat 54 communicates with the interior of chamber 24 and extends through 14 and 38 in sealing relationship and contacts electrode 26. Electrode 26 has a central region generally at 56 which defines an aperture therethrough. Sheath 54 extends to this aperture and terminates at the top surface 28 of electrode 26. The other end of sheth 54 is coupled to vacuum pumps 58 that are used to evacuate the interior of chamber 24.

The reactant gases required to coat the semiconductor substrates wafers 30 contained within chamber 24 are introduced into tube 50 and flow as indicated by the arrows.

An rf glow discharge reaction is caused to occur within chamber 24 between electrodes 18 and 26 when the rf source 22 is activated and appropriate gases are introduced into chamber 24 through 50. Gas shield 38 is typically spaced ¼ or less from electrode 26. This close spacing substantially inhibits the glow discharge reaction which occurs between electrode 18 and the top surface 28 of electrode 26 from occurring around end portion 34 and bottom portion 32 of electrode 26. This serves to intensify the rf glow discharge reaction immediately above semiconductor substrates 30. In addition, the gas shield 38 permits the effective use of higher input rf power than is possible without the shield. Without shield 38 there is a tendency for the gases introduced into the chamber 24 to react below electrode 26 and therefore to dissipate before reaching semiconductor substrates 30. Thus, without the shield 38 the increasing of rf power beyond a certain point is not particularly helpful in intensifying the glow discharge reaction above the substrates 30 where it is important that the reaction occur.

The vacuum pumps of FIG. 1 are selected to be compatible with a high gas flow rate of approximately 2 liters minute minutes at greater than 1 mm pressure. A 150 cfm Leybold-Heraeus roots blower backed with two 17 cfm mechanical pumps running in parallel were found to be sufficient to achieve the needed high gas flow rate. Additional pumping capacity comprising a cryopanel and a 400 l/s vacuum pump located below an isolation valve (not illustrated) in the reactor 10 of FIGS. 1 and 2 is utilized to initially pump the reactor 10 and 100 to a base pressure of $\sim 10^{-6}$mm.

In operation, semiconductor substrates 30 are loaded on support surface 28. The reactor 10 is then sealed, closed, and pumped down to $10^{-6}$mm. The heaters connected or part of the electrodes 26 are turned on and the semiconductor substrates are heated to approximately 275° C. The vacion isolation valve is closed and reactant gases are admitted to the reactor and the roots blower valve is opened again. A dynamic pressure of approximately $600\mu$ is established in the reactor with the input gases flowing at the desired flow rates. Thereafter the roots blower valve is throttled to the desired pressure. The rf power source is now activated to the desired power level.

A fully functional reactor very similar to the reactor 10 of FIG. 1 was constructed with sections 12, 14 and 16 all being stainless steel and electrode 18 being aluminum. Two tubes 44 are utilized and the gas ring utilized is a tubular member having a diameter of 5 inches. The spacing between the U-shaped section 42 of gas shield 38 and the end portion 34 of electode 26 is approximately ¼. The spacing between the top surface 28 of electrode 26 and electrode 18 is approximately 1.

Another fully functional reactor similar to that of reactor 10 of FIG. 1 was constructed with sections 12 and 14 made of aluminum and sidewalls 16 made of pyrex. Since section 12 is electrically isolated from sections 14 and 16, it is not necessary that the electrical connection from the impedance matching network 20 to electrode 18 be electrically isolated from top plate section 12. In this reactor the gas ring is a cylindrical member having a diameter of approximately 14 inches. There are approximately 120 gas outlet apertures of 40 mils each in diameter equally spaced around this gas ring. The spacing between the end portion 34 of electrode 26 and the U-shaped portion 42 of gas shield 38 is approximately ⅛ of an inch. The distance between surface 28 electrode 26 and electrode 18 is approximately 1 inch.

Figure 3:
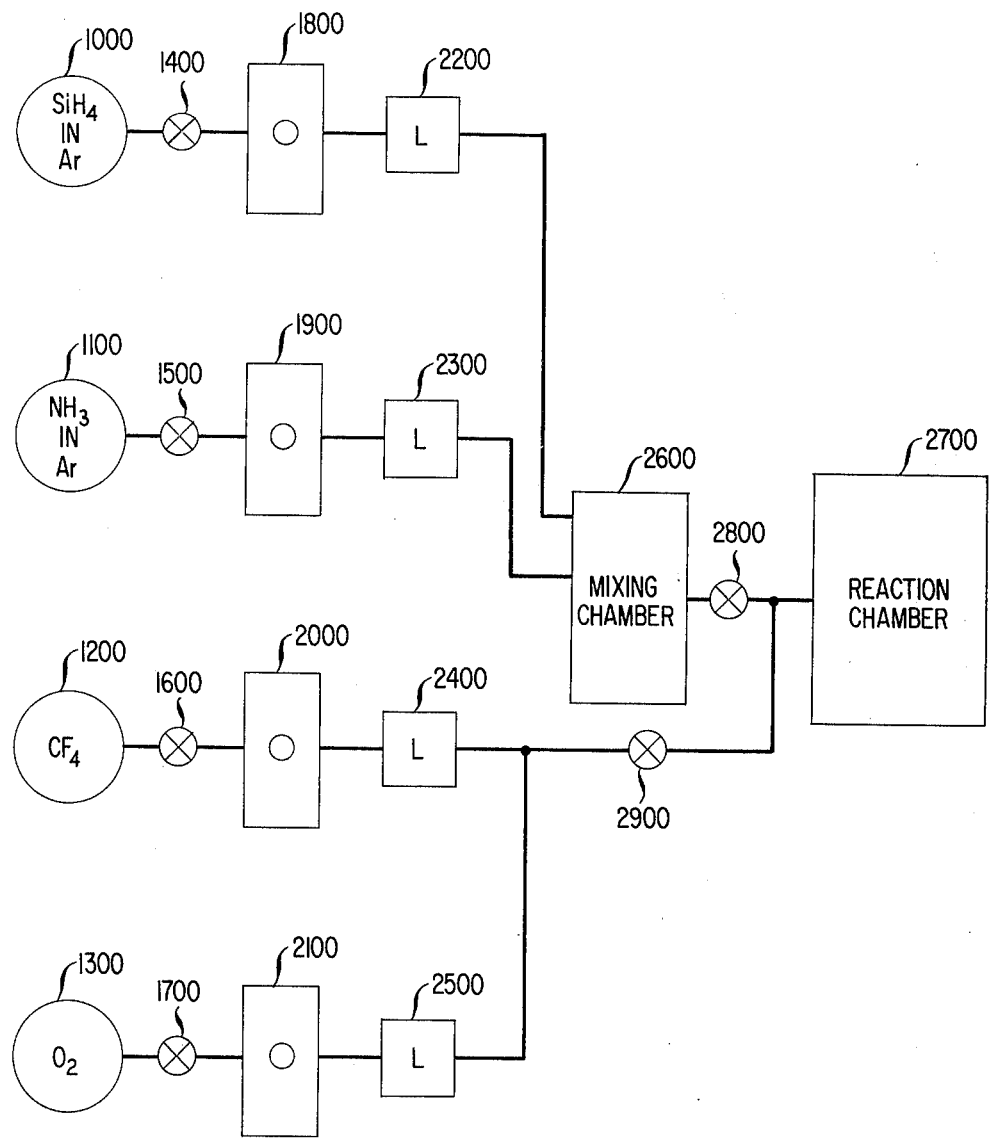
FIG. 3 illustrates a flow diagram of gases that may be used with the reactor of FIGS. 1 and 2.

Referring now to FIG. 3, there is illustrated a flow diagram of reactant gases that may be used in the reactor of FIGS. 1 and 2. Sources of silane ($SiH_4$) in a carrier gas argon (Ar) 1000, ammonia ($NH_3$) in a carrier gas argon (Ar) 1100, carbon tetrafluoride ($CF_4$) 1200, and oxygen ($o_2$) are connected through a separate one of valves 1400, 1500, 1600 and 1700, respectively, to separate flow meters 1800, 1900, 2000 and 2100, respectively, and then through separate leak valves 2200, 2300, 2400, and 2500, respectively. The outputs of leak valves 2400 and 2500 are both connected through a valve 2900 to a reaction chamber 2700. Reaction chamber 2700 can be the chamber 24 of FIGS. 1 and 2. The outputs of leak valves 2200 and 2300 are both connected to mixing chamber 2600. Mixing chamber 2600 is in communication with reaction chamber 2700 through valve 2800.

The reactant gases $SiH_4$ and $NH_3$ mix in the mixing chamber 2600 and then pass through valve 2800 into reaction chamber 2700. During the time of depositing inorganic films on semiconductor substrates, valves 1600, 1700, 2400, 2500 and 2900 are closed and valves 1400, 1500, 2200, 2300 and 2800 are open.

After one or more deposition runs, inorganic films form on the electrodes 18 and 26 and on other areas in the reactor of FIGS. 1 and 2. To clean off the films, the heaters and rf source of FIG. 1 are turned on and valves 1600, 1700, 2400, 2500 and 2900 are all opened, and valves 1400, 1500, 2200, 2300 and 2800 are all closed. The films deposited on internal parts of the reactor are cleaned by the resulting rf glow discharge reaction (the reactant gases being $CF_4$ and $O_2$) and a new set of semiconductor substrates can then be placed in the reactor for deposition of protective films thereon.

Advantageously all interconnecting tubing connecting the sources of gases illustrated in FIG. 3 to the reactor of FIGS. 1 and 2 are made of stainless steel to insure these connections are essentially leak-free. This essentially prevents any but the desired gases from entering the systems during the deposition operations.

Essentially pure sources of $SiH_4$, $NH_3$, and Ar could be easily substituted for the $SiH_4$ in Ar and $NH_3$ in Ar sources.

In the first set of operating conditions described below the reactor was essentially as illustrated in FIGS. 1 and 2 without the gas shield and with electrode 18 in electrical contact with top plate 12. Side wall 16 is pyrex in this case. The following operating conditions were utilized to deposit protective films having the denoted characteristics on semiconductor substrates;

|  | 1st Operating Condition using apparatus of FIGS. 1 & 2 without gas shield) | 2nd Operating Condition (using apparatus of FIGS. 1 & 2) |
|---|---|---|
| Reactant gas | $SiH_4/NH_3/Ar$ | $SiH_4/NH_3/Ar$ |
| $SiH_4$ | 1.25% | 1.70% |
| $NH_3$ | 1.56% | 2.39% |
| Ar | 97.19% | 95.91% |
| Total gas flow (SCCM) | 2000 | 2320 |
| Pressure in reactor ($\mu$) | 1000 | 950 |
| Substrate temperature (degrees C) | 330 deg. C | 275 deg. C |
| Tuned RF - power (watts) (reflected power =~ 0) | 60 | 250 |
| Thickness of deposited layer ($\mu$) | 1.1 | 1.1 |
| Stress in resulting layer ($10^9$ dynes/cm$^2$) | 1-2 (tension) | 1-5 (tension) |
| Etch rate in BHF (Angstroms per min.) | 175 | 180 |
| Density (GCM$^{-3}$) | 2.4 | 2.55 |
| Composition of resulting layer (Si/N) | 1.1 | 1.05 |
| Refractive Index | 2.15 | 2.05 |
| Cracking resistance (deg. C to which substrates with deposited layers could be raised without cracking) | 400 | 450 |
| Adhesion of deposited layer | Good | Good |
| Step Coverage of deposited layer | Very good | Very good |
| Scratch resistance | Good | Good |
| Dielectric constant | 6.9 | 6.4 |
| Breakdown strength ($10^6$ V/cm) | 3.4 | 3.9 |
| Resistivity at $2 \times 10^6$ V/cm (ohm/cm) | $5 \times 10^{12}$ | $4 \times 10^{13}$ |
|  | 3rd Operating Condition (using apparatus of FIGS. 1 & 2) | 4th Operating Condition (using apparatus of FIGS. 1 & 2) |
| Reactant gas | $SiH_4/NH_3/Ar$ | $SiH_4/NH_3/Ar$ |
| $SiH_4$ | 1.78% | 1.78% |
| $NH_3$ | 2.25% | 2.25% |
| Ar | 95.97% | 95.97% |
| Total gas flow (SCCM) | 2320 | 2320 |
| Pressure in reactor ($\mu$) | 950 | 950 |
| Substrate temperature (degrees C) | 275 deg. C | 275 deg. C |
| Tuned RF - power (watts) (relected power =~ 0) | 300 | 400 |
| Thickness ($\mu$) | 1.1 | 1.1 |
| Stress in resulting layer ($10^9$ dynes/cm$^2$) | 1-2 (compression) | 1-2 (compression) |
| Etch rate in BHF (Angstroms per min) | 125 | 75 |
| Density (GCM$^{-3}$) | 2.75 | 2.90 |
| Composition of resulting layer (Si/N) | 0.8 | 0.75 |
| Refractive Index | 2.00 | 1.94 |
| Cracking resistance (deg. C to which substrates with deposited layers could be raised without cracking) | 550 | 550 |
| Adhesion of deposited layer | Good | Good |
| Step Coverage of deposited layer | Very good | Very good |
| Scratch resistance | Good | Good |
| Dielectric constant | 6.8 | 5.8 |
| Breakdown strength ($10^6$ V/cm) | 5.0 | 8.1 |
| Resistivity at $2 \times 10^6$ V/cm (ohm/cm) | $3 \times 10^{15}$ | $5 \times 10^{19}$ |

The tuned rf power indicated for each of the above operating conditions was read from a meter on the rf power supply. It is to be appreciated that the effective rf input power density between the electrodes of a reactor is a function of the geometry of the electrodes and the spacing therebetween. The reactors utilized with the above operating conditions have a circular top electrode having a radius of 14 inches. Electrode 18 was separated from the electrode 26 by approximately 1. A reactor with different type of size of electrodes and different spacing between electrode would require an appropriately different input rf power in order to produce films on semiconductor substrates with essentially the same characteristics as described herein.

The first operating condition is useful for depositing protective films on semiconductor substrates which utilize aluminum metallization. The aluminum metallization can easily withstand temperatures at and above the 330° C used. The second through fourth operating conditions can be used with semiconductor substrates which have aluminum or gold with titanium, palladium and gold beam leads since the temperature utilized is below that at which titanium and palladium and gold interact.

Cracking of the protective films allows moisture and impurities (i.e., sodium) to attack the surface of the semiconductor substrates and thereby destroy the circuitry contained thereon. It is therefore very important that protective films be as crack-resistant as possible.

The fourth operating condition results in films which are substantially stoichiometric silicon nitride ($Si_3N_4$) and which contain essentially no other organic combinations or argon incorporation. The physical characteristic of the resulting $Si_3N_4$ film are superior to $Si_3N_4$ films produced by chemical vapor deposition (CVD) processes in that they are much less susceptible to cracking than the CVD produced $Si_3N_4$. The reason for this is that the silicon nitride films resulting from operating condition four have relatively low compressive stress and not the relatively high tensile stress of the CVD produced films.

It is important to note that in all of applicants' operating conditions careful precautions were taken to limit the presence of nitrogen ($N_2$) or oxygen ($O_2$) in the reactor during the glow discharge reactions. it has been determined through experimentation that the addition of even small amounts of $N_2$ (up to 2%) or $O_2$ (up to 0.2%) in the reactant gas mixture can significantly adversely affect the characteristics of the resulting films. The addition of only 2% nitrogen to the reactant gases resulted in an order of magnitude increase in tensile stress of the resulting film, and an increase in the BHF etch rate of over 7 times. The addition of only 0.2% $O_2$ to the reactant gases resulted in a 7-times increase in the BHF etch rate.

Using the second operating conditions as a standard, the effects of varying the five main process parameters, namely, (A) Gas pressure, (B) Total gas flow, (C) Pressure, (D) Substrate temperature and (E) RF input power into the reactor, were studied. The graphs illustrated in FIGS. 4, 5, 6, 7 and 8 each illustrate on the abscissa one of the variables denoted above, and on the respective ordinate axis some of the resulting characteristics of the film deposited on semiconductor substrates.

A. Gas Composition

Figure 4:
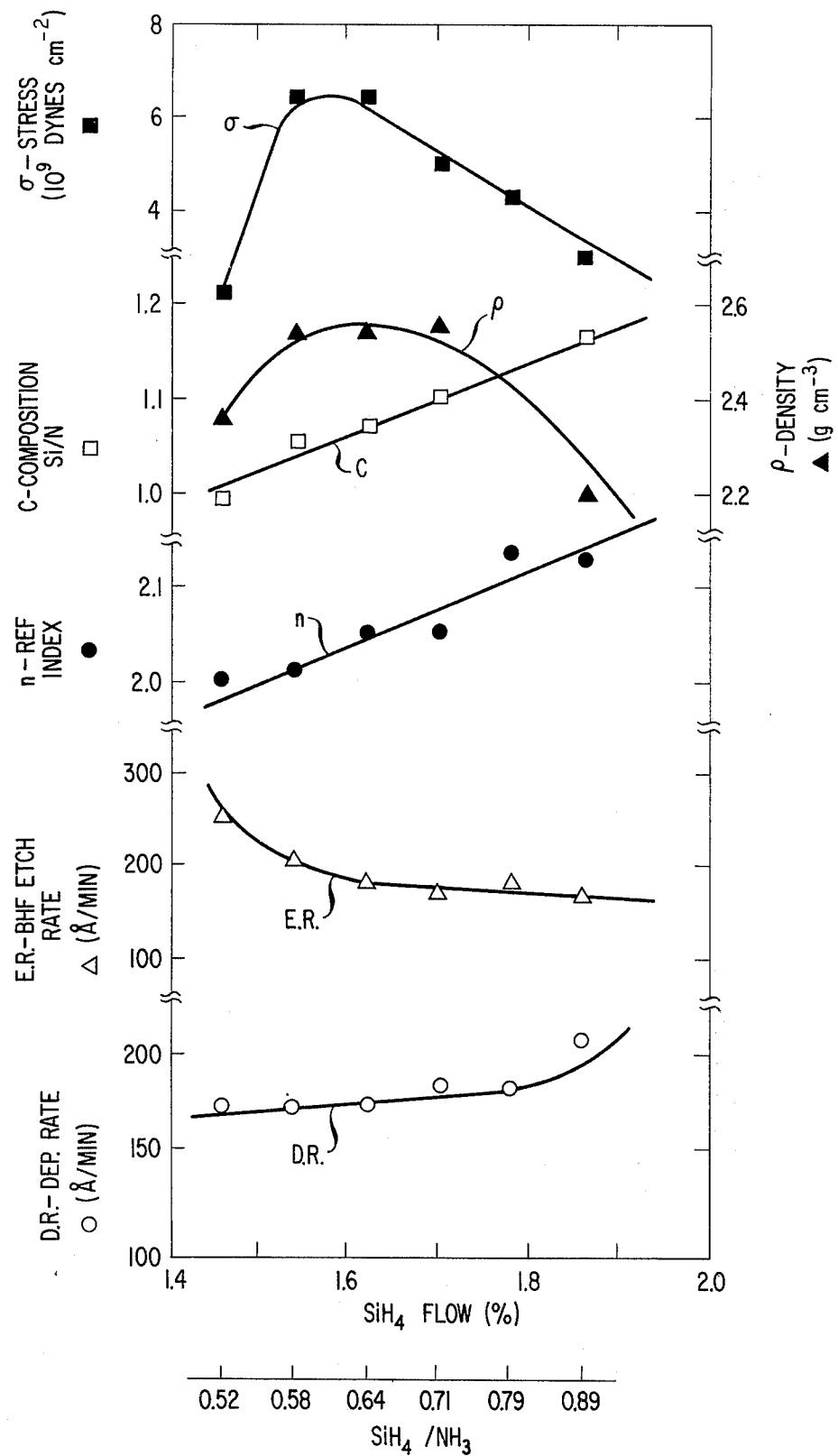

The graph of FIG. 4 illustrates the effect of increasing $SiH_4$ concentration ($1.4 \leq \% \; SiH_4 \leq 1.9$; $0.5 \leq SiH_4/NH_3 \leq 0.9$) in the reacting gases. These gas compositions were achieved by adjusting the flow-meters for 3%$SiH_4$-Ar and 5%$NH_3$-Ar to various complementary settings so as to keep the total flow constant.

As expected, increasing the $SiH_4$ concentration in the gas led to a corresponding linear increase in the Si/N ratio in the film (from ~1.0 to ~1.2), and a linear increase in the refractive index (from ~1.9 to ~2.2). For the lowest $SiH_4$ concentration used, ($SiH_4/NH_3 = 0.52$), the film density was found to be relatively low (~2.3 gcm-116 $^3$), and the BHF etch-rate was corresponding high (250 angstroms/min.). With increasing $SiH_4/NH_3$ ratio, the film density $\rho$ showed a broad peak ($\rho \approx 2.55$ gcm$^{-3}$) for $0.58 \leq SiH_4/NH_3 \leq 0.79$. The $\rho$ decreased again at $SiH_4/NH_3$ ~0.9; however, this was not accompanied by corresponding increase in BHF etch-rate, presumably because the films now had a much higher Si content (Si/N~1.2). The film $\sigma$, which was always tensile, showed a peak at $SiH_4/NH_3$~0.6, which is located at a slightly lower $SiH_4$ concentration than that for the peak in $\rho$ While most of our work has involved operating conditions in which the ratio of silane to ammonia was between 0.5 and 0.9, which is believed the preferred range, it may be feasible to deposit useful protective films with ratios outside this range.

B. Gas Flow

Figure 5:
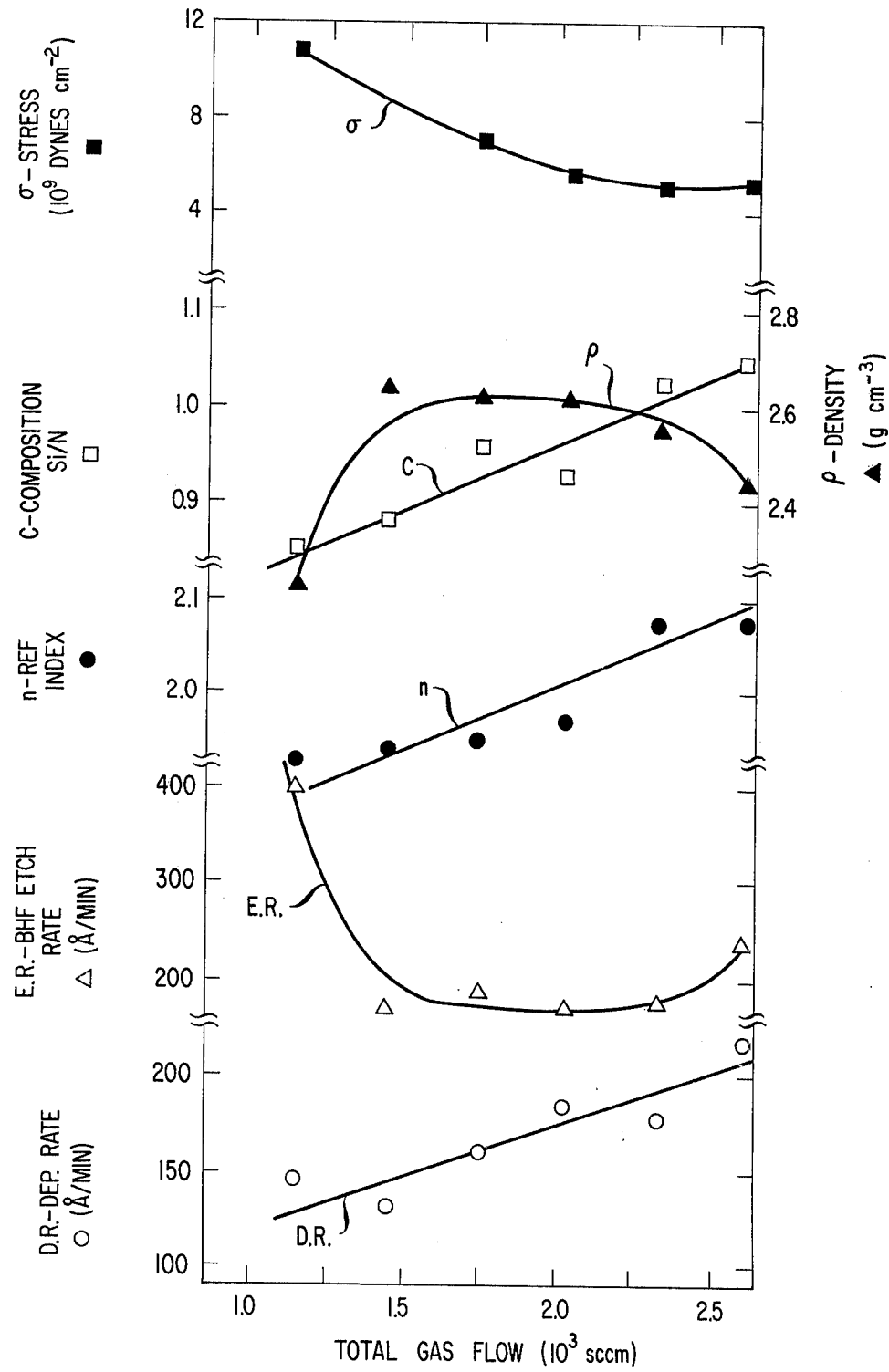

The graph of FIG. 5 illustrates the effect of increasing the total gas flow on the other variables of the process. The total gas flow was varied in the range 1.0 to 2.5 liters min$^{-1}$, with the $SiH_4/NH_3$ ratio constant at 0.71 (%$SiH_4 = _{1.70}$). It may be seen from FIG. 5 that increasing the flow led to a higher deposition rate (from 120 to 200 angstroms/min, a greater refractive index, and a larger Si/N ratio in the film (from 0.8 to 1.05). For this range of film composition, the film density seems to have a dominant effect on the BHF etch rate; a broad maximum in $\rho$ corresponds to a broad minimum in the etch rate. The tensile stress descreases with increasing flow; this is probably the result of a higher film purity (with respect to possible nitrogen/oxygen contamination) as the flow is increased.

C. Pressure

Figure 6:
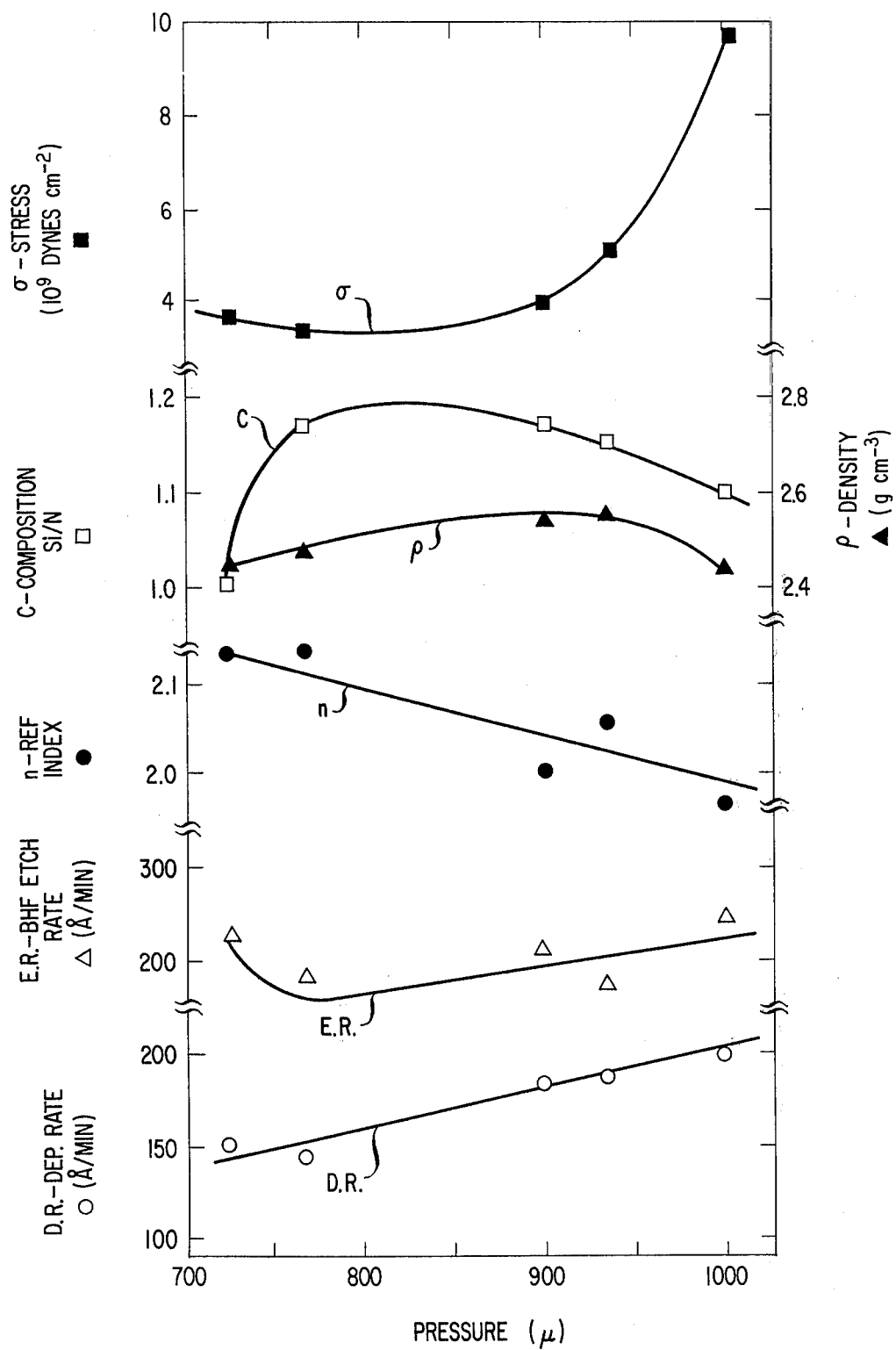

The graph of FIG. 6 illustrates the effect of increasing pressure on the other variables of the process. The average pressure during film deposition was varied from ~700 to 1000μ (±25μ). As shown in FIG. 6, increasing the pressure also led to a higher deposition rate, whereas the density and the BHF etch rate did not change much. The refractive index decreased linearly. This generally (i.e., for pressures $\geq 750\mu$) correlates with a decrease in the Si/N ratio in the film.

D. Substrate Temperature

Figure 7:
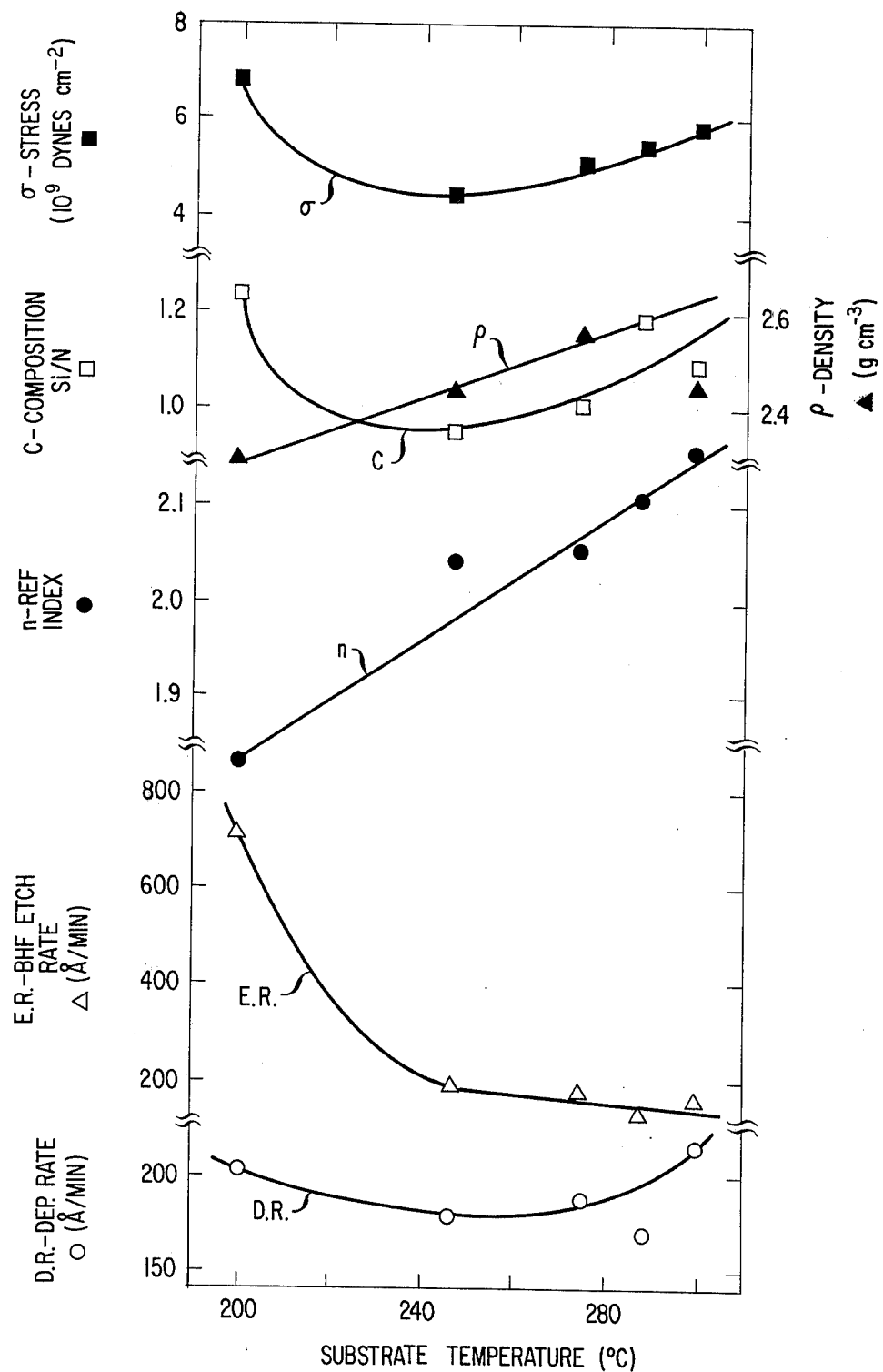

The graph of FIG. 7 illustrates the effects of varying the temperature of the semiconductor substrates on the other variables of the process. The limited range of substrate temperatures studied ($200° \leq T_S \leq 300°$ C) was influenced by the desire to stay below temperatures at which Pd-Au interdiffusion (in Ti/Pd/Au metallization) becomes excessive. As shown in FIG. 7, $T_S$ (substrate temperature) has a pronounced effect on the BHF etch rate, which decreases almost exponentially with increasing $T_S$. The decrease in BHF etch-rate is associated with a linear increase in the film density, $\rho$ and in the refractive index, $n$. Thus, for films deposited at 200° C, the BHF etch rate was 700 angstroms/min, the density was ~2.3 gcm$^{-3}$ and the refractive index was ~1.85. Interestingly, these films also had a rather large Si/N ratio (~1.2) and a high tensile stress (7×10$^9$ dynes cm$^{-2}$). With increasing $T_S$, both $\sigma$ and the Si/N ratio in the film displayed a shallow minimum at ~250° C; however, a higher $T_S$ of 275° C was preferred because it led to films with yet greater density (2.55 gcm$^{-3}$) and somewhat lower etch-rate without an excessive increase in $\sigma$.

E. RF Input Power

The graph of FIG. 8 illustrates the effect of increasing the rf input power. Tuned rf input powers were investigated in the range of 100 to 350 watts (reflected power = 0). For this series of experiments, the $SiH_4/NH_3$ ratio was kept constant at 0.8, and $SiH_4$ at 1.81. For increasing rf power, there was found to be a rapid and linear increase in the film $\rho$ (weight-gain measurements. using $\mu$ thick films) from 2.2 gcm$^{-3}$ at 100 watts to 2.8 gcm$^{-3}$ at 350 watts. Films (1$\mu$) thick with lower density had a distinct yellowish tinge to them when deposited on Al-metallized devices, whereas those with densities $\geq 2.4$ gcm$^{-3}$ appeared to be grayish and more truly transparent. Both the film $\rho$ and BHF etch-rate showed a bimodal behavior at ~275 watts. Below this power level the stresses were very low tensile (~0.5×10$^9$ dynes cm$^{-2}$) and the etch-rates were relatively high (275 to 325 angstroms/min). At rf powers $\geq 300$ watts, the stresses, which had been tensile, became compressive (1–2×10$^9$ dynes cm$^{-2}$) and the BHF etch rates were relatively low (<150 angstroms/min). Significantly, the refractive index showed a decrease with increasing rf power. The refractive index, film composition, and film density have been correlated using the Lorentz-Lorentz equation.

Finally, it should be understood that the specific embodiment of the invention described is merely illustrative of the general principles and various modifications thereof are feasible, including change in dimensions, geometry, and materials. Moreover, it should be evident that other gases may be utilized to form films of other materials.

What is claimed is:

1. Coating apparatus comprising:

an evacuable chamber;

a member located in said chamber having a support region adapted to support at least one object and a central region which defines an aperture therethrough;

means for facilitating a radio frequency discharge within the chamber adjacent the object to form a flow discharge plasma from reactant gases introduced into the chamber;

exhaust means in communication with the centrally disposed aperture in the member; and coating gas-vapor feed means located adjacent the support region of the member such that gas-vapor feed is induced to flow across the support region of the member in a radial flow and out through the exhaust means, the coating gas-vapor feed means being adapted to substantially inhibit any glow plasma discharge reaction from occurring until reactant gases introduced into he apparatus through the coating gas-vapor means reach the support region of the member.

2. Apparatus for coating a substrate comprising:

an evacuable chamber;

a member located in said chamber having a top region which is adapted to hold the substrate and a central region defining an aperture therethrough;

means for generating a radio frequency discharge within the chamber adjacent the substrate to form a glow discharge plasma from reactant gases introduced into said chamber;

means for establishing a radial flow from an outer portion of the member which is adapted to hold the substrate toward and out of the aperture of the reactant gases suitable for forming the plasma and coating on the substrate;

means in communication with the aperture for exhausting the gases; and means for substantially confining said plasma glow discharge to a zone which encompasses the top region of the member and extends substantially vertically upward therefrom.

3. The apparatus of claim 2 further comprising heating means contained within the chamber for heating the substrate to a preselected temperature.

4. The apparatus of claim 2 wherein the means for generating a glow discharge includes substantially parallel electrodes within the chamber.

5. The apparatus of claim 4 wherein the chamber is electrically coupled to one of the electrodes.

* * * * *

UNITED STATES PATENT AND TRADEMARK OFFICE
CERTIFICATE OF CORRECTION

PATENT NO. : 4,033,287
DATED : July 5, 1977
INVENTOR(S) : Frank B. Alexander, Jr., Cesar D. Capio, Victor E. Hauser, Jr., Hyman J. Levinstein, Cyril J. Mogab, Ashok K. Sinha and Richard S. Wagner It is certified that error appears in the above-identified patent and that said Letters Patent are hereby corrected as shown below:

Column 1, line 16, "Houser" should read --Hauser--; line 54, "therwith" should read --therewith--. Column 2, line 14, "electrode" should read --electrodes--; line 44, "readial" should read --radial--; line 52, after "18" insert --is--; line 59, "3" should read --30--; line 64, after "substrates" delete "wafers"; line 67, "os" should read --of--. Column 3, line 1, "Plurality" should read --plurality--; line 13, "sheat" should read --sheath--; line 19, "sheth" should read --sheath--; line 22, after "substrates" delete "wafers"; line 29, after "1/4" insert --inch--; line 49, after "liters" insert --per--, after "minute" delete "minutes"; line 63, "vacion" should read --Vacion--. Column 4, line 10, after "1/4" insert --inch--; line 12, after "1" insert --inch--; line 27, after "28" insert --of--; line 34, "o$_2$" should read --O$_2$--. Column 5, line 14, before "using" insert --(--.

Column 6, line 32, after "1" insert --inch--, change "of" to read --or--; line 33, "electrode" should read --electrodes--. Column 7, line 36, "gcm-116$^3$" should read --gcm$^{-3}$--; line 37, "corresponding" should read --correspondingly--; line 46, after "ρ" insert a period; line 60, after "min" insert --)--;

UNITED STATES PATENT AND TRADEMARK OFFICE
CERTIFICATE OF CORRECTION

PATENT NO. : 4,033,287                                    Page 2 of 2
DATED : July 5, 1977
INVENTOR(S) : Frank B. Alexander, Jr., Cesar D. Capio, Victor E. Hauser, Jr., Hyman J. Levinstein, Cyril J. Mogab, Ashok K. Sinha and Richard S. Wagner It is certified that error appears in the above-identified patent and that said Letters Patent are hereby corrected as shown below:

line 65, "descreases" should read --decreases--. Column 8, line 17, after "300°" delete the quotation mark; line 44, after "measurements" change the period to a comma; line 45, "µ" should read --1µ--; line 50, "ρ" should read --σ--. Column 9, claim 1, line 11, "flow" should read --glow--; claim 1, line 23, "he" should read --the--.

Signed and Sealed this

Sixth Day of February 1979

[SEAL]

Attest:

RUTH C. MASON
*Attesting Officer*

DONALD W. BANNER
*Commissioner of Patents and Trademarks*

UNITED STATES PATENT AND TRADEMARK OFFICE
SECOND CERTIFICATE OF CORRECTION

PATENT NO. : 4,033,287
DATED : July 5, 1977
INVENTOR(S) : Frank B. Alexander, Jr., Cesar D. Capio, Victor E. Hauser, Jr., Hyman J. Levinstein, Cyril J. Mogab, Ashok K. Sinha and Richard S. Wagner It is certified that error appears in the above-identified patent and that said Letters Patent are hereby corrected as shown below:

Column 1, line 17, "Levenstein" should read --Levinstein--.
Column 6, line 30, "radius" should read --diameter--.

Signed and Sealed this

Twenty-fifth Day of December 1979

[SEAL]

Attest:

SIDNEY A. DIAMOND

Attesting Officer

Commissioner of Patents and Trademarks